(12) United States Patent
Tsukamoto

(10) Patent No.: US 6,458,641 B2
(45) Date of Patent: *Oct. 1, 2002

(54) METHOD FOR FABRICATING MOS TRANSISTORS

(75) Inventor: Masanori Tsukamoto, Kanagawa (JP)

(73) Assignee: Sony Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/339,847

(22) Filed: Jun. 25, 1999

(30) Foreign Application Priority Data

Jun. 26, 1998 (JP) .......................................... 10-180056

(51) Int. Cl.[7] .............................................. H01L 21/336
(52) U.S. Cl. ....................... 438/197; 438/585; 438/592; 438/595
(58) Field of Search ................................ 438/197, 198, 438/199, 256, 585, 592, 595, 588

(56) References Cited

U.S. PATENT DOCUMENTS 6,017,809 A * 1/2000 Inumiya ..................... 438/585
6,121,086 A * 9/2000 Kuroda et al. .............. 438/256

* cited by examiner

Primary Examiner—David Nelms
Assistant Examiner—Dung Anh Le
(74) Attorney, Agent, or Firm—Sonnenschein, Nath & Rosenthal

(57) ABSTRACT

In PMOS having a gate electrode 7 of a p-type polysilicon film 5 along with a silicon nitride film 13, boron diffusion from the p-type polysilicon film 5 and boron punching through the gate oxide film 4 are prevented, thereby stabilizing the properties of the PMOS. Hydrogen existing in the silicon nitride film 13 accelerates boron diffusion from the film 5. To prevent it, all subsequent steps after the step of forming the silicon nitride film 13 are effected within a temperature range within which the boron diffusion is not accelerated by hydrogen. Forming the silicon oxide film 14 through reduced pressure CVD is effected in a furnace at a temperature lower than 850° C. Annealing for dopant activation in the compensation region 17 to be formed on the substrate in the bottom of the contact hole 16 is effected in a manner of RTA (rapid thermal annealing) at a temperature lower than 1000° C.

8 Claims, 9 Drawing Sheets

SELF-ALIGNED TiSix LAYER FORMATION

GATE OXIDE FILM THICKNESS DEPENDENCE OF FLAT BAND VOLTAGE

FORMATION OF p-TYPE POLYSILICON FILM (EXAMPLE 1)

GATE ELECTRODE PATTERNING,
AND LDD ION IMPLANTATION

SIDE WALL FORMATION,
AND SOURCE/DRAIN ION IMPLANTATION

FORMATION OF INTERLAYER INSULATING FILM

CONTACT HOLE FORMATION,
AND COMPENSATING ION IMPLANTATION

FORMATION OF INTERLAYER INSULATING FILM (EXAMPLE 2)

CONTACT HOLE BEING FORMED (BUT NOT FINISHED)

CONTACT HOLE FINISHED

FORMATION OF UPPER INTERCONNECTION LAYER

LDD ION IMPLANTATION IN PMOS
FORMING REGION (EXAMPLE 3)

LDD ION IMPLANTATION IN NMOS FORMING REGION

FORMATION OF SILICON NITRIDE FILM FOR SIDE WALLS

SIDE WALL FORMATION,
AND SOURCE/DRAIN ION IMPLANTATION

FORMATION OF Ti FILM

SELF-ALIGNED TiSix LAYER FORMATION

METHOD FOR FABRICATING MOS TRANSISTORS

RELATED APPLICATION DATA

The present application claims priority to Japanese Application No. P10 180056 filed Jun. 26, 1998, which application is incorporated herein by reference to the extent permitted by law.

BACKGROUND OF THE INVENTION

1. Field of the Invention

The present invention relates to a method for fabricating MOS transistors, in particular to a method for fabricating MOS transistors having both a p-type gate electrode of a p-type MOS transistor (PMOS) and a silicon nitride film on a substrate, in which boron (B) in the p-type gate electrode is effectively prevented from diffusing away and from punching through the adjacent gate oxide film.

2. Description of the Related Art

Complementary MOS transistor (CMOS) circuits having both an N-type MOS transistor (NMOS) and a p-type MOS transistor (PMOS) on one and the same substrate have the advantages of reduced power consumption and quick operation as fine patterning to increase the degree of integration in fabricating them is easy, and they have many applications, for example, for memory units and logical units and for other various LSI devices.

Various films of $n^+$-type polysilicon films as well as their polycide films or polymetal films as combined with high-melting point metal silicide films or high-melting-point metal films have heretofore been used as the materials for constituting the gate electrode in PMOS for CMOS, like those for the gate electrode in NMOS. The reason is because $n^+$-type polysilicon films are well durable in high-temperature processes. In addition, for its channel profile, since the gate electrode of the film of that type has an embedded structure, it enjoys a high bulk mobility and therefore has the advantage of quick operation.

However, in such embedded channel-type MOS transistors, the tip of the depletion layer extending from the source/drain region is too near to another one adjacent thereto in the deep part of the substrate, as being influenced by the gate electric field, thereby often causing punch-through. This means the difficulty in controlling the short channel effect in coming deep sub-micron generation devices in the art. Therefore, it is necessary to change the embedded channel structure to a surface channel structure.

In order to attain the surface channel profile, the gate electrode in PMOS shall be made of a $p^+$-type polysilicon film.

Another reason why the $p^+$-type polysilicon film is desired for the gate electrode material in PMOS is as follows:

In conventional CMOS circuits where the gate electrodes in NMOS and PMOS are all made of an $n^+$-type polysilicon film, the work function differs between NMOS and PMOS and the threshold voltage $V_{th}$ in them shall be asymmetric to each other owing to that difference. Therefore, boron ions are implanted in a shallow site in the PMOS channel region so as to make the threshold voltage $V_{th}$ in the two transistors NMOS and PMOS nearly equal to each other (generally, at most 1 V). However, the ion implantation for threshold voltage control increases the dopant concentration in the surface of the substrate, whereby the carrier mobility near the surface of the substrate is reduced. The reduction in the carrier mobility is contradictory to quick operation of transistors. Therefore, in coming transistor devices, reducing the channel dopant concentration is indispensable.

However, using a $p^+$-type polysilicon film having a large work function in forming the gate electrode in PMOS enables symmetrical threshold voltage $V_{th}$ in NMOS and PMOS without increasing the channel dopant concentration. This leads to symmetrical input-output characteristics of transistors having a basic gate structure of CMOS inverters, and even to the improvement in the symmetrical signal transmission characteristics of such transistors.

The CMOS structure in which the gate electrode in PMOS has a p-type conductivity and that in NMOS has an n-type conductivity is referred to as a dual gate CMOS.

In an ordinary process of fabricating CMOS circuits, in general, the gate electrode in NMOS and that in PMOS are all made through patterning of a polysilicon film common thereto. In the process, therefore, different dopant ions are separately implanted in the regions to be the gate electrodes for the two, NMOS and PMOS, via masks, thereby making the gate electrodes for the two have different types of conductivity. Briefly, arsenic (As) ions or phosphorus (P) ions are implanted in the region to be the $n^+$-type gate electrode, while boron (B) ions are in the region to be the $p^+$-type electrode.

However, the boron implantation is problematic in that the boron introduced into the silicon film often diffuses away when the substrate is exposed to high temperatures in subsequent steps. In that condition, the boron thus having diffused from the silicon film is taken into the gate oxide film or, as the case may be, it punches through the gate oxide film to reach the substrate (Si). The boron diffusion will occur in various scenes in the subsequent steps of, for example, activated annealing of source/drain regions, self-aligned silicification (process for SALICIDE, Self-ALIgned siliCIDE), reflowing of interlayer insulating films, etc., and it causes the increase in the threshold voltage, $V_{th}$, in PMOS, the increase in the sub-threshold swing, and even the reduction in the reliability of gate insulating films.

In addition, it is known that the boron diffusion is accelerated by a silicon nitride film, if formed, around the boron-implanted silicon film.

In one experiment, various MOS capacitors were fabricated and subjected to different types of heat treatment to discuss the problem with them. Precisely, different types of MOS capacitors were fabricated, comprising a gate electrode of a p-type polysilicon film as layered on an n-type silicon (Si) substrate via a gate oxide film having a varying thickness. In some of those, the gate electrode was coated with a silicon nitride film having a thickness of 80 nm via a thin silicon oxide film therebetween. These MOS capacitors were subjected to different types of heat treatment, and their flat band voltage depending on the thickness of the gate oxide film in them was checked. FIG. 1 shows the gate oxide film thickness dependence of the flat band voltage of the tested MOS capacitors. In this, the vertical axis indicates the flat band voltage(V); and the horizontal axis indicates the thickness (nm) of the gate oxide film.

The p-type gate electrode in those MOS capacitors tested contained boron, and its boron concentration was at least $1 \times 10^{20}/cm^3$.

The silicon nitride film was formed through reduced CVD at 760° C., for which was used a mixed gas of dichlorosilane ($SiCl_2H_2$) and ammonia ($NH_3$), and its thickness was 80 nm.

Three types of heat treatment, rapid thermal annealing (RTA) at 1000° C. for 10 seconds, furnace annealing in $N_2$ at 800° C. for 60 minutes, and furnace annealing in $N_2$ at 760° C. for 135 minutes, were applied to the samples singly or as combined.

Of those heat treatment conditions, the furnace annealing in $N_2$ at 760° C. for 135 minutes corresponds to the condition for reduced pressure CVD to form a silicon nitride (SiN) film having a thickness of about 80 nm.

During every heat treatment, the surface of the substrate of each sample was entirely covered with a thin capping oxide film so as to protect the boron in the gate electrode from being released away in the ambient vapor phase.

In FIG. 1, the graph I indicates the flat band voltage change in the MOS capacitors not coated with a silicon nitride film, for which the capacitors were subjected to RTA at 1000° C. for 10 seconds.

The graph II indicates the flat band voltage change in the MOS capacitors not coated with a silicon nitride film, for which the capacitors were subjected to cycle heat treatment of furnace annealing in $N_2$ at 760° C. for 135 minutes→furnace annealing in $N_2$ at 800° C. for 60 minutes→RTA at 1000° C. for 10 seconds.

The graph III indicates the flat band voltage change in the silicon nitride film-coated MOS capacitors, in which the voltage change was caused by heating the capacitors for forming the silicon nitride film on them.

The graph IV indicates the flat band voltage change in the silicon nitride film-coated MOS capacitors, for which the capacitors were subjected to RTA at 1000° C. for 10 seconds.

In those MOS capacitors, when the boron in the gate electrode punches through the gate oxide film to reach the Si substrate, the flat band voltage therein shifts in the positive direction, as being influenced by the surface charge of the Si substrate. As in all those four graphs, the flat band voltage increased with the reduction in the thickness of the gate oxide film. However, as in the graphs I and II, the increase in the flat band voltage is small in the samples not coated with a silicon nitride film. As opposed to those, in the silicon nitride film-coated samples, the increase in the flat band voltage is somewhat larger, as in the graph III. Especially in the silicon nitride film-coated samples that had been subjected to high-temperature heat treatment after the step of forming the silicon nitride film thereon, the increase in the flat band voltage is great, as in the graph IV. This indicates the increase in the amount of boron having punched through the gate oxide film in the silicon nitride film-coated samples having been subjected to the high-temperature post-heating treatment.

From these data, it is obvious that, when a silicon nitride film is formed on a substrate having thereon a p-type polysilicon film and when the substrate is exposed to high temperatures in the film-forming step and in any subsequent step, then boron diffusion is accelerated in that condition and boron will readily punch through a gate oxide film.

In actual MOS transistor fabrication, a silicon nitride film is formed, for example, between interlayer insulating films of silicon oxide for the purpose of increasing the withstand voltage of the interlayer insulating films, or in the vicinity just above the source/drain region as an etching stopping film in a self-aligned contact process, or as a side wall around gate electrodes in a process of self-aligned silicification (SALICIDE, Self-ALIgned siliCIDE).

In general, the silicon nitride film of that type is formed through reduced pressure CVD, for which is used a mixed gas of dichlorosilane ($SiCl_2H_2$) and ammonia ($NH_3$) as so mentioned above, and a large amount of hydrogen as generated in this reaction is inevitably taken in the film formed. In this connection, recently, it has been clarified that the hydrogen thus taken in the film causes the accelerated boron diffusion. At present, however, it is extremely difficult to form a silicon nitride film not containing hydrogen, and it is therefore also difficult to retard the boron diffusion that shall be accelerated by hydrogen.

Lowering the temperature for heat treatment or shortening the time for heat treatment will be effective for retarding boron diffusion. However, the former is problematic in that the crystal defects as caused by ion implantation or dry etching could not be restored sufficiently, and will increase leak current; and the former is also problematic in that the dopants could not be activated sufficiently so that the resistance of the diffusion layer and the interconnection layer will increase.

For preventing boron from punching through a gate oxide film, a method of rapid thermal nitrogenation (RTN) of the film has been proposed, which is effected in a nitrogenation atmosphere of $NH_3$, $N_2O$ or the like. However, this method is still problematic in that the thickness of the gate insulating film thus processed increases and the carrier mobility lowers to degrade transistor characteristics, and that the fixed charge and the interfacial level increase to lower the reliability of the gate insulating film. For these reasons, the method is not always favorable.

Another method has been proposed, which comprises increasing the grain size of the crystal grains that constitute the polysilicon film to form a gate electrode to thereby reduce the intergranular boundaries to form the paths through which boron diffuses. In this method, a gate electrode is first formed from an amorphous silicon film, then an n-type dopant and a p-type dopant are introduced into the NMOS and PMOS-forming regions, respectively, through ion implantation thereby to attain the dopant introduction into the gate electrode and into the source/drain regions all at a time, and thereafter the amorphous silicon film of the gate electrode is converted into a polysilicon film through crystal growth to be attained simultaneously with activated annealing of the dopants.

In that method, however, the degree of crystallization of amorphous silicon into polysilicon greatly depends on the condition for heat treatment which the amorphous silicon film formed shall undergo in the subsequent steps. Therefore, it could not be said that silicon grains could grow all the time to a satisfactory degree in that method, and, in addition, it could not also be said that the grain growth in the method may be all the time reproducible.

As in the above, at present, the conventional measures for preventing boron diffusion from p-type gate electrodes are not finally conclusive.

Given that situation, the object of the present invention is to provide a method for fabricating MOS transistors having a p-type gate electrode, especially that containing boron as the dopant, along with a hydrogen-containing silicon nitride film, in which boron diffusion from the p-type gate electrode and even boron punching through a gate oxide film can be effectively retarded.

SUMMARY OF THE INVENTION

Specifically, to attain its object as above, the invention provides a method for fabricating MOS transistors, which comprises a step of forming a gate electrode of a p-type silicon film on a gate insulating film as formed on the surface of a semiconductor substrate, and a step of forming a silicon nitride film on the substrate, and in which all steps after the step of forming the silicon nitride film are effected within a temperature range within which the diffusion of the p-type dopant existing in the p-type silicon film is prevented from being accelerated by the hydrogen existing in the silicon nitride film.

BRIEF DESCRIPTION OF THE DRAWINGS

FIG. 2 to FIG. 6 show one embodiment of the present invention as applied to a process of fabricating a PMOS structure that contains a silicon nitride film as a part of the interlayer insulating film, of which;

FIG. 2 is a schematic cross-sectional view showing a step of forming a p-type polysilicon film on an Si substrate having been previously subjected to element spacing, well formation and gate oxidation, FIG. 3 is a schematic cross-sectional view showing a step of patterning a multi-layered film that contains the p-type polysilicon film as formed in the step of FIG. 2, to form a gate electrode, followed by LDD ion implantation in the patterned structure, FIG. 4 is a schematic cross-sectional view showing a step of forming a side wall around the gate electrode as formed in the step of FIG. 3, followed by ion implantation in the source/drain region, FIG. 5 is a schematic cross-sectional view showing a step of forming an interlayer insulating film to cover the gate electrode as formed in the step of FIG. 4, in which the interlayer insulating film has a multi-layered structure of a silicon oxide film, a silicon nitride film and a silicon oxide film as layered in that order to cover the gate electrode, and FIG. 6 is a schematic cross-sectional view showing a step of forming contact holes through the interlayer insulating film as formed in the step of FIG. 5, followed by compensating ion implantation in the source/drain region as exposed outside the bottom of the contact holes.

FIG. 7 to FIG. 10 show another embodiment of the invention as applied to a self-aligned contact process of fabricating a DRAM structure, of which;

FIG. 7 is a schematic cross-sectional view showing a step of forming an interlayer insulating film to cover the neighboring gate electrodes (word lines), FIG. 8 is a schematic cross-sectional view showing a step of partly etching the interlayer insulating film as formed in the step of FIG. 7, until the silicon nitride film is exposed outside, and in this step illustrated, a contact hole is being formed, FIG. 9 is a schematic cross-sectional view showing a step of further etching the remaining interlayer insulating film to complete the contact hole, and FIG. 10 is a schematic cross-sectional view showing a step of embedding an upper interconnection (bit line) into the contact hole as completed in the step of FIG. 9.

FIG. 11 to FIG. 16 show still another embodiment of the invention as applied to a SALICIDE process of fabricating a CMOS structure, of which;

FIG. 11 is a schematic cross-sectional view showing a step of LDD ion implantation in a PMOS forming region on a substrate, FIG. 12 is a schematic cross-sectional view showing a step of LDD ion implantation in an NMOS forming region on the same substrate, FIG. 13 is a schematic cross-sectional view showing a step of forming a silicon nitride film on the entire surface of the substrate, in which the film formed is for side walls, FIG. 14 is a schematic cross-sectional view showing a step of anisotropically etching back the silicon nitride film as formed in the step of FIG. 13 to give side walls, followed by ion implantation in the source/drain in both PMOS and NMOS forming regions, FIG. 15 is a schematic cross-sectional view showing a step of forming a Ti film on the entire surface of the substrate, and FIG. 16 is a schematic cross-sectional view showing a step of forming a self-aligned TiSix layer on the surface of the gate electrode and the source/drain region, through thermal treatment of the substrate.

DETAILED DESCRIPTION OF THE INVENTION

Figure 1:
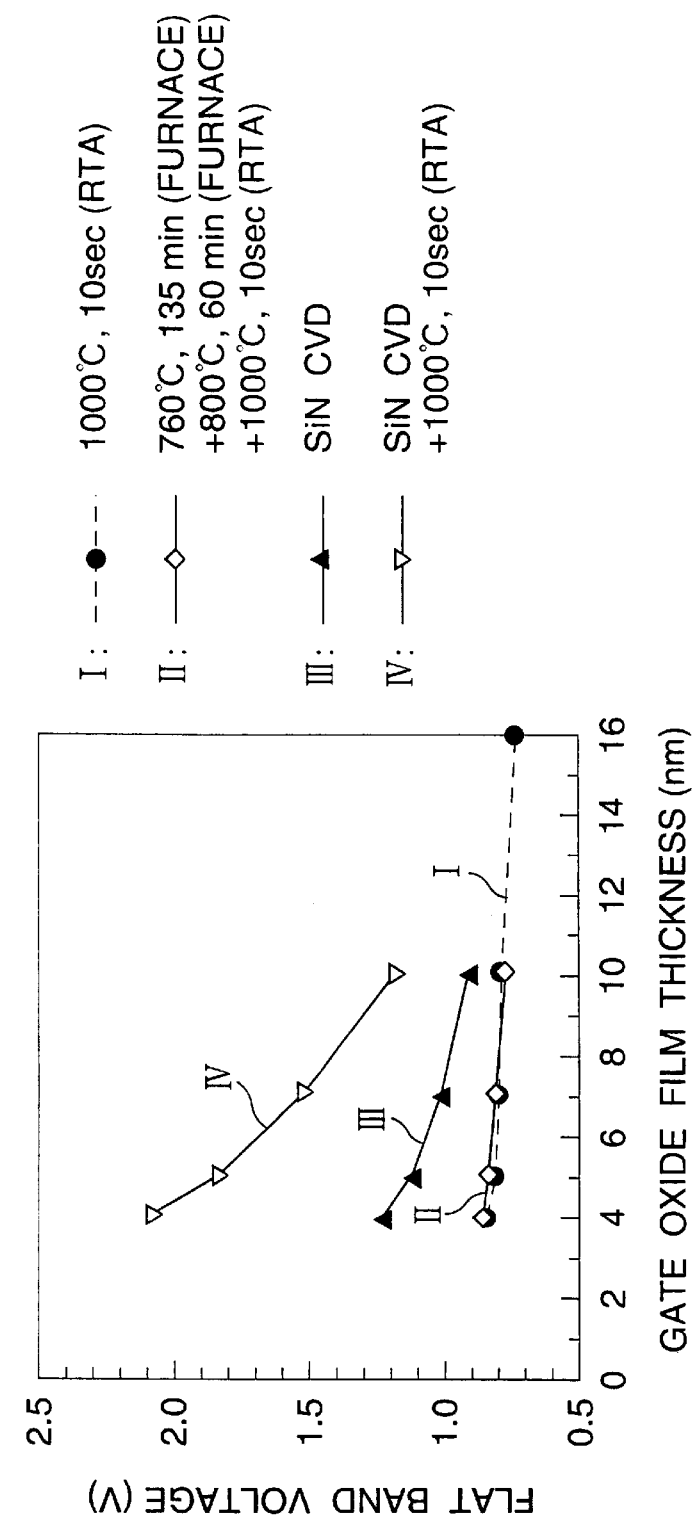
FIG. 1 shows graphs of flat band voltage change owing to boron diffusion in different heat treatment conditions versus varying thickness of gate oxide films in p-type polysilicon film—having MOS capacitors coated or not coated with a silicon nitride film.

As in the above, the object of the present invention is to prevent the accelerated diffusion of the p-type dopant from the gate electrode of a p-type silicon film. Preferably, the p-type dopant is boron (B). This is because the p-type dopant of which the accelerated diffusion is significantly problematic is boron, as so mentioned hereinabove with respect to the related art. Boron of the order of at least $1 \times 10^{19}/cm^3$ exists in a p-type silicon film practicable as a gate electrode.

The p-type silicon film for use in the invention may be any of a polysilicon film or an amorphous silicon film.

The gate electrode to be formed on the substrate may be of a p-type silicon film alone or, if desired, may have a multi-layered structure comprising a p-type silicon film and a high-melting-point metal silicide film or a high-melting-point metal film as layered thereover. A composite film of a polysilicon film and a high-melting-point silicide film is known as a polycide film; and a composite film of a polysilicon film and a high-melting-point metal film is known as a polymetal film. These are effective for lowering the resistance of gate electrodes.

For the high-melting-point metal silicide film, employable are any known films of, for example, WSix, TiSix, MoSix, TaSix, PtSix, NiSix, etc. Of those, a film of WSix is typical. The WSix film may be formed through reduced pressure CVD of reducing $WF_6$ with $SiH_4$ or $SiCl_2H_2$ (dichlorosilane).

The high-melting-point metal silicide film may also be formed in a SALICIDE process. Briefly, a polysilicon film or an amorphous silicon film formed on a substrate is patterned to give a gate electrode thereon, then the entire surface of the substrate is coated with a high-melting-point metal film, which is then annealed to thereby self-alignedly silicifying the upper surface of the gate electrode and the surface of the active area of the substrate (including source/drain region, etc.), and thereafter the non-reacted high-melting-point metal film is removed. For the high-melting-point metal film, employable are any known films of, for example, W, Ti, Mo, Ta, Pt, Ni, etc. These metal films may be formed through reduced pressure CVD, plasma CVD, sputtering or the like.

In the invention, the silicon nitride film may be formed in any known manner. One typical method that has heretofore been most popularly employed in the art comprises CVD, for which is used a starting mixed gas of a silane compound and a reducing compound. The silicon nitride film to be formed according to this method naturally contains hydrogen. In the invention, all steps after the step of forming the silicon nitride film are effected within a specifically defined range of low temperatures. Therefore, in the invention, hydrogen existing in the silicon nitride film formed has no negative influences on the subsequent steps. In other word, for forming the silicon nitride film in the invention, the best step having been surely established in the art and producing the best results can be selected.

Typical functions of the silicon nitride film are as follows: (1) The film may be a part of an interlayer insulating film to cover a gate electrode. (2) It may serve as an etching stopping film in forming contact holes through the interlayer insulating film to cover the gate electrode. (3) It may be a film to form side walls around the gate electrode. These will be described in detail in Examples 1 to 3 to follow hereinunder.

Apart from those, the silicon nitride film has still other applications, for example, serving as a capacitor dielectric film in DRAM, as an anti-etching film for treatment with diluted hydrofluoric acid, and as an anti-oxidation film for oxidation processes.

In the invention, the temperature range for all steps to be effected after the step of forming the silicon oxide film varies depending on those subsequent steps themselves.

Naturally in those subsequent steps, high-temperature treatment bring s about the problem of dopant diffusion. The high-temperature treatment typically includes RTA and furnace annealing.

RTA is one typical technique of activating dopants having been introduced into semiconductor substrates and silicon films. In the invention, the temperature for RTA is specifically defined to be lower than 1000° C. At a temperature of 1000° C. or higher, the p-type dopant diffusion as accelerated by hydrogen existing in the silicon nitride film is extremely difficult to retard in RTA. The lowermost limit of the temperature for RTA is not specifically defined. For example, where RTA is directed to dopant activation, it shall be naturally effected at a temperature not lower than the lowermost temperature indispensable to the activation. Therefore, the lowermost limit of the temperature for RTA shall naturally be determined, depending on the object of RTA.

In MOS transistor fabrication, furnace annealing is indispensable to the substrate after the step of forming a silicon nitride film on the substrate, for example, when an interlayer insulating film of silicon oxide is formed on the substrate through reduced pressure CVD. In the invention, the temperature for furnace annealing is defined to be lower than 850° C. At a temperature of 850° C. or higher, the p-type dopant diffusion as accelerated by hydrogen existing in the silicon nitride film is extremely difficult to retard in furnace annealing. The lowermost limit of the temperature for furnace annealing is not specifically defined. For example, where furnace annealing is directed to promoting the formation of silicon oxide films, it shall be naturally effected at a temperature not lower than the lowermost temperature indispensable to the film formation. Therefore, the lowermost limit of the temperature for furnace annealing shall naturally be determined, depending on the object of furnace annealing.

Needless-to-say, the accelerated degree of dopant diffusion, especially that of boron diffusion in such high-temperature treatments depends on the time for the treatments. For RTA and furnace annealing discussed herein, however, the time is not specifically defined so far as it does not overstep the ordinary time for those thermal treatments generally employed in the art of semiconductor device fabrication and so far as the thermal treatments are effected within the temperature range specifically defined herein. In the specifically defined condition for the temperature range as above, any accelerated diffusion of p-type dopants is effectively retarded in the method of the invention.

The invention is described in more detail with reference to the following Examples, which, however, are not intended to restrict the scope of the invention.

EXAMPLE 1

This is one embodiment of the invention as applied to a process of fabricating a PMOS structure that contains a silicon nitride film as a part of the interlayer insulating film, for which referred to are FIG. 2 to FIG. 6.

First, elements on a p-type Si substrate 1 were spaced from each other according to a known LOCOS process. Concretely, for example, a field oxide film 2 was formed on the substrate 1 through wet oxidation at 950° C.

Next, an n-type well 3 was formed through $p^+$ ion implantation via a resist mask (not shown) in the PMOS forming region. For the condition for the ion implantation, for example, the ion accelerating energy was 330 keV, and the ion dose was $8 \times 10^{12}/cm^2$.

Next, after ion implantation in the surface layer part of the active region for threshold voltage ($V_{th}$) control followed by ion implantation in the depth of the substrate for forming therein an embedded layer for punch-through retardation, the substrate 1 was subjected to pyrogenic oxidation with, for example, a mixed gas of $H_2/O_2$ at 850° C. to thereby form a gate oxide film 4 having a thickness of about 5 nm on the surface of the active region.

Next, a p-type polysilicon film 5 was formed on the entire surface of the substrate. This was formed, for example, as follows: First, a polysilicon film having a thickness of from 50 to 200 nm was deposited through reduced pressure CVD with a raw material gas of $SiH_4$ at a film-forming temperature of from 580 to 620° C., and then $B^+$ ions were implanted in the film at a dose of $1-5 \times 10^{15}/cm^2$ to form the p-type polysilicon film 5. After this, the substrate was subjected to furnace annealing in $N_2$ at 800° C. for 10 minutes so as to activate the boron in the film. In place of furnace annealing, the substrate may also be subjected to RTA.

In place of introducing boron into the film through post-ion implantation as above, a dopant gas of, for example, diborane or the like may be added to the raw material gas for CVD so as to introduce boron in the film being formed. In this case, the boron introduction is attained simultaneously with the film formation.

In place of forming the p-type polysilicon film 5 as above, a p-type amorphous silicon film may also be formed.

Figure 2:
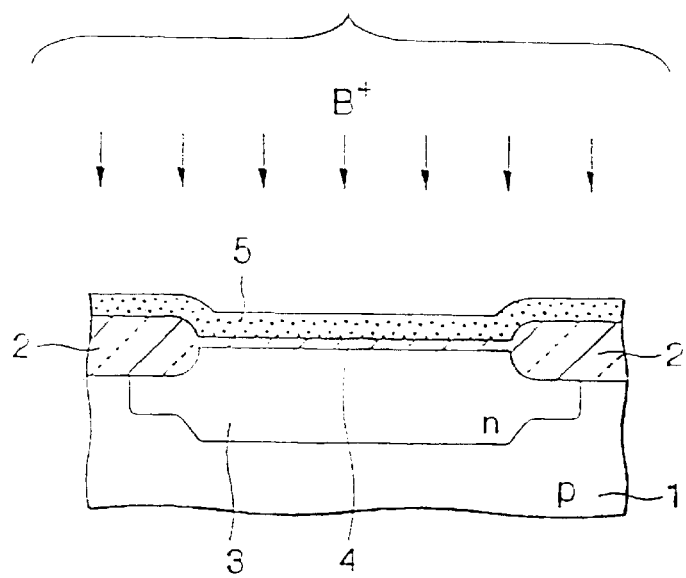

FIG. 2 shows the condition of the substrate after the stage as above.

Next, a WSix film 6 and an offset oxide film 8 were deposited in that order on the p-type polysilicon film 5.

The WSix film 6 was formed, for example, through reduced pressure CVD with a mixed gas of $WF_6/SiCl_2H_2$ at a deposition temperature of 580° C., and its thickness was about 100 nm.

The offset oxide film 8 was formed, for example, through reduced pressure CVD with a mixed gas of $SiH_4/O_2$ at a deposition temperature of 420° C., and its thickness was about 150 nm.

Next, the offset oxide film 8, the WSix film 6 and the p-type polysilicon film 5 were etched all via a resist pattern (not shown) serving as a mask. Precisely, the offset oxide film 8 was etched anisotropically with a fluorocarbon gas, while the WSix film 6 and the p-type polysilicon film 5 were etched with a mixed gas of $Cl_2/O_2$ also anisotropically, for which the selective ratio of the two films 5 and 6 to the gate oxide film 4 was kept fully great. As a result of the etching, formed was a gate electrode 7 having a polycide structure of a layered pattern of the p-type polysilicon film 5 and the WSix film 6.

Next came LDD (Lightly Doped Drain) ion implantation for forming an LDD region. The ion implantation condition was, for example, as follows: The $BF_2^+$ ion accelerating energy was 20 keV, and the ion dose was $2\times10^{13}/cm^2$. Through the ion implantation, for which the pattern of the gate electrode 7 served as a mask, a $p^-$-type LDD region 9 was formed in a self-aligned manner in the element forming region of the Si substrate 1.

Figure 3:
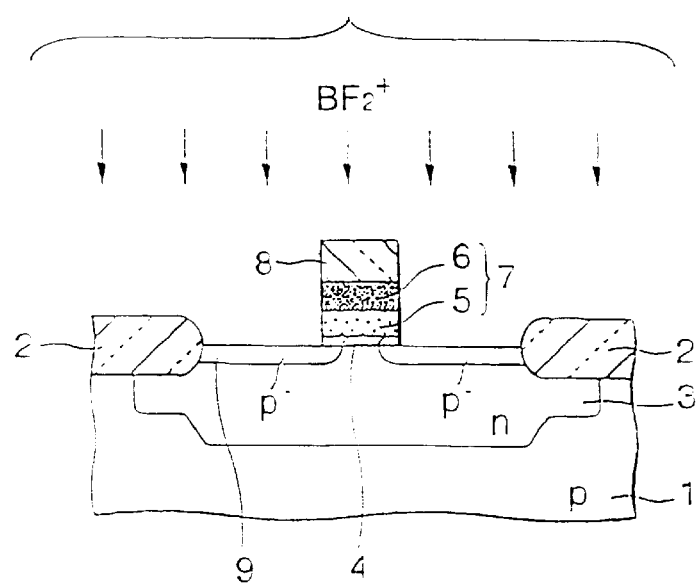

FIG. 3 shows the condition of the substrate after the stage as above.

Next, a silicon oxide film having a thickness of about 150 nm was deposited on the entire surface of the substrate through reduced pressure CVD, and this was anisotropically etched back to form a side wall 10 around the gate electrode Next came source/drain ion implantation for forming a source/drain region. The ion implantation condition was, for example, as follows: The $BF_2^+$ ion accelerating energy was 20 keV, and the ion dose was $3\times10^{15}/cm^2$. Through the ion implantation, for which the pattern of the gate electrode 7 having the side wall 10 therearound served as a mask, a $p^+$-type source/drain region 11 was formed in a self-aligned manner in the element forming region of the Si substrate 1.

The boron having been introduced through the LDD ion implantation and the source/drain implantation was activated, for example, through RTA at 1000° C. for 10 minutes.

Figure 4:
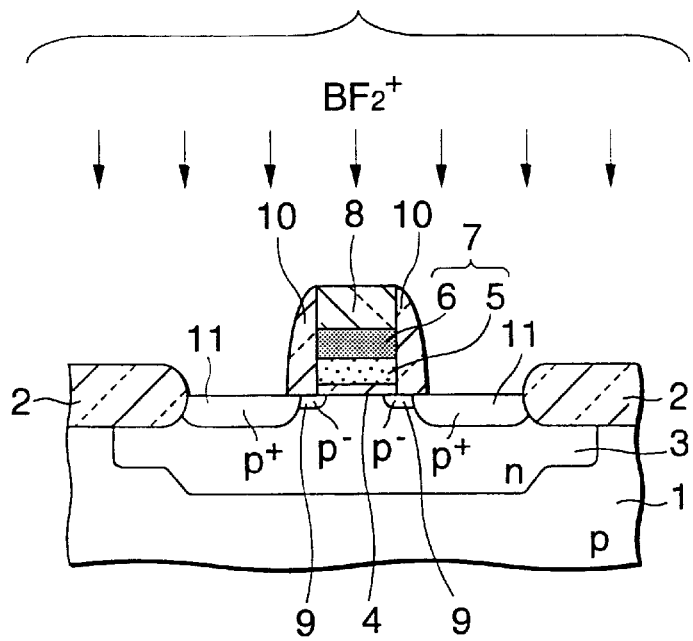

FIG. 4 shows the condition of the substrate after the stage as above.

Figure 5:
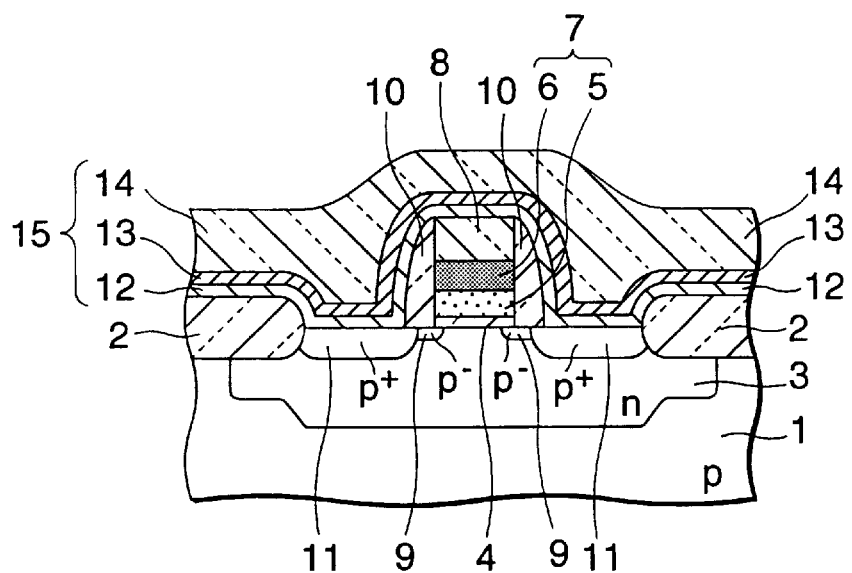

Next, as in FIG. 5, an interlayer insulating film 15 was formed to cover the substrate.

The interlayer insulating film 15 was composed of a silicon oxide film 12, a silicon nitride film 13 and a silicon oxide film 14 as layered in that order on the substrate.

The silicon oxide film 12 was formed, for example, through reduced pressure CVD at 420° C., for which was used a mixed gas of $SiH_4/O_2$, and it had a thickness of about 100 nm.

The silicon nitride film 13 was formed, for example, through reduced pressure CVD at 760° C., for which was used a mixed gas of $SiCl_2H_2/NH_3$, and it had a thickness of from about 30 nm to about 100 nm. As its barrier property of preventing the penetration of water and sodium therethrough is better than that of silicon oxide films, the silicon nitride film 13 is provided for the purpose of increasing the withstand voltage of the interlayer insulating film 15. However, the drawback of the film 13 is that hydrogen existing therein will accelerate the diffusion of boron in the p-type polysilicon film 5.

Therefore, in this Example, all steps after the previous steps as above were effected at temperatures at which the boron diffusion is not accelerated by that hydrogen.

Concretely, the temperature in the step of forming the silicon oxide film 14 was specifically controlled as follows: The silicon oxide film 14 to be the uppermost layer of the interlayer insulating film 15 must be specifically planarized so that it could absorb as much as possible the surface level difference in the underlying layers. Therefore, in this embodiment, a BPSG (boron-phosphorus-doped silicate glass) film or an NSG (non-doped silicate glass) film was formed, for example, through reduced pressure CVD at 700° C., for which was used a raw material gas containing TEOS (tetraethoxysilane), and the film formed had a thickness of about 300 nm. The temperature range for furnace annealing within which boron diffusion is accelerated by hydrogen is not below 850° C. Therefore, the temperature of 700° C. at which the film was formed herein is a safe temperature not causing accelerated boron diffusion.

The silicon oxide film 14 may also be formed in an HTO (High Temperature Oxide) process at around 800° C., which is one type of reduced pressure CVD. After having been formed, the silicon oxide film 14 may be subjected to CMP (Chemical Mechanical Polishing) or may be etched back, whereby its surface may be effectively planarized to a higher degree.

Figure 6:
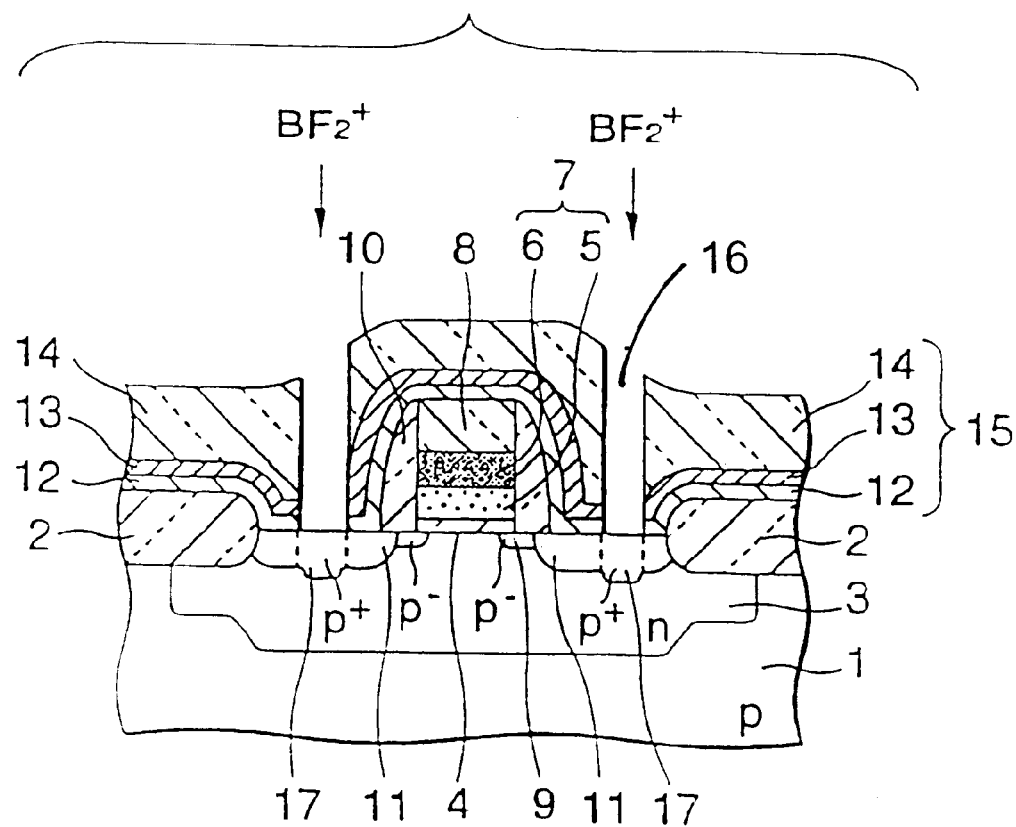

Next, the interlayer insulating film 15 was subjected to anisotropic dry etching via a resist pattern (not shown) serving as a mask to form contact holes 16 in the source/drain region 11, as in FIG. 6.

Next came compensating ion implantation for forming a compensation region 17 in the Si substrate 1 as exposed outside at the bottom of each contact hole 16. The compensation region 17 is a dopant diffusion region, which is for retarding pn-junction leak current. The pn-junction leak current may come when the Si substrate 1 is overetched in the etching step for forming the contact holes 16, or when the hole pattern is mismatched in the photolithography step to be effected prior to the etching step whereby the field oxide film 2 is overetched in the etching step. The ion implantation condition for the region 17 was, for example, as follows: The $BF_2^+$ ion accelerating energy was 20 keV, and the ion dose was $3\times10^{15}/cm^2$.

Next came RTA at 900° C. for 10 seconds for activating the boron having been introduced into the compensation region 17. The temperature range for RTA within which boron diffusion is accelerated by hydrogen is not below 1000° C. Therefore, the temperature of 900° C. at which the boron activation was effected herein is a safe temperature not causing accelerated boron diffusion.

After this, in an ordinary process tungsten plugs were formed to fill the contact holes 16, and an upper interconnection layer of Al was formed to complete a PMOS. Even though the gate oxide film 4 therein was thin and had a thickness of only 5 nm, the PMOS fabricated in this Example had the advantage of stable and quick operation without being troubled by flat band voltage increase.

EXAMPLE 2

This is another embodiment of the invention as applied to a self-aligned contact process of fabricating a DRAM structure, for which referred to are FIG. 7 to FIG. 10. In those drawings, some numeral references are the same as those in FIG. 2 to FIG. 6 referred to hereinabove.

Two gate electrodes 7 as in Example 1 were formed adjacent to each other in an element forming region. Also as in Example 1, an LDD region 9, a side wall 10 and a source/drain region 11 were formed. In DRAM, the gate electrodes 7 function as word lines.

Next, a silicon oxide film 12, a silicon nitride film 13 and a silicon oxide film 14 were layered in that order to form an interlayer insulating film 15.

The silicon oxide film 12 was formed, for example, through reduced pressure CVD at 720° C., for which was used a mixed gas of $TEOS/O_2$, and it had a thickness of about 20 nm.

The silicon nitride film 13 was formed, for example, through reduced pressure CVD at 760° C., for which was used a mixed gas of $SiCl_2H_2/NH_3$, and it had a thickness of from about 30 nm to about 100 nm. The silicon nitride film 13 serves as an etching stopping layer in the subsequent etching step for forming a contact hole 19 between the two electrodes 7. Specifically, in the etching step, the silicon oxide film 14 of which the thickness varies greatly in local sites is anisotropically dry-etched to form the contact hole 19, and the silicon nitride film 13 acts as an etching stopping layer in the etching step.

The silicon oxide film 14 was a BPSG film or an NSG film having a thickness of about 600 nm. This was formed, for example, through reduced pressure CVD at 700° C., for which was used a raw material gas containing TEOS (tetraethoxysilane). In this step, boron diffusion in the p-type polysilicon film 5 in the gate electrode 7 was not accelerated by hydrogen. The silicon oxide film 14 was then subjected to CMP to cut off its thickness of 300 nm, whereby the surface of the film 14 was planarized.

Figure 7:
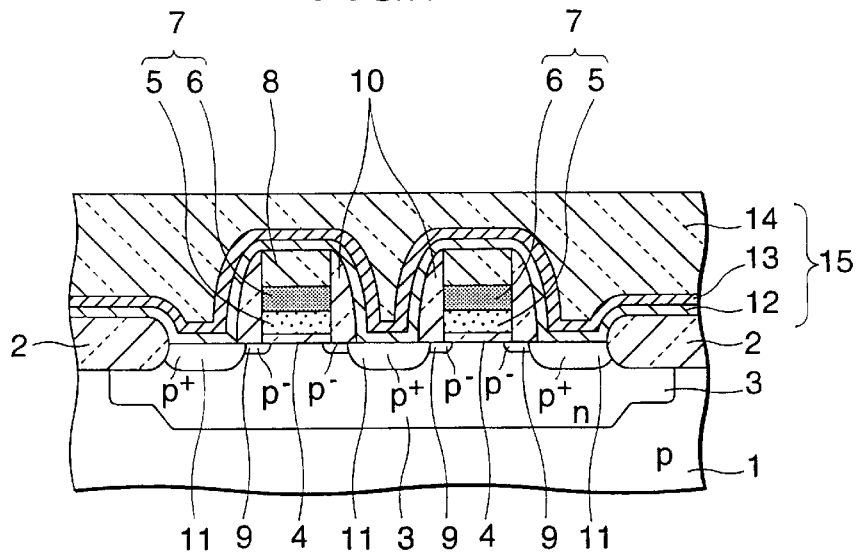

FIG. 7 shows the condition of the substrate after the stage as above.

Figure 8:
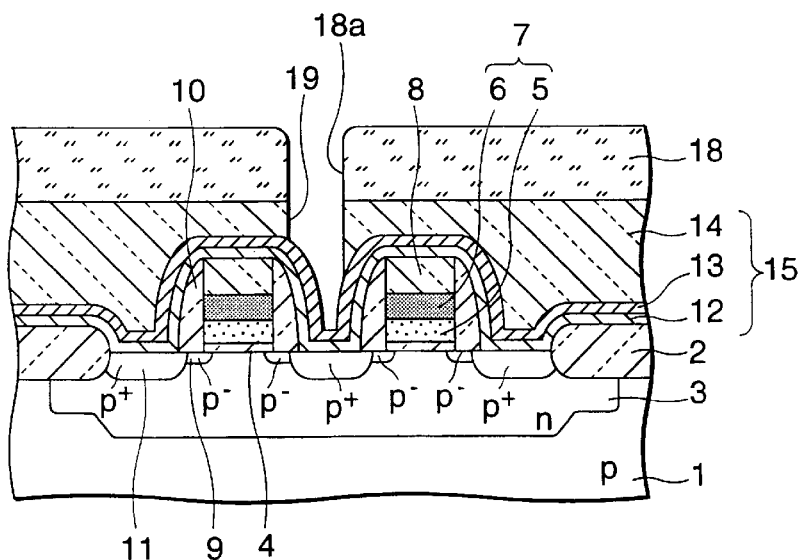

Next, as in FIG. 8, a resist pattern 18 was formed on the silicon oxide film 14, and the silicon oxide film 14 as exposed outside in the opening 18a of the pattern 18 was anisotropically dry-etched. The dry etching was effected, for example, by the use of a magnetron RIE (reactive ion etching) device, using a mixed gas of $CHF_3/CO$. For this, the selective ratio of the film 14 to the silicon nitride film 13 was kept large. In this step, a contact hole 19 was formed but was not finished.

The silicon nitride film 13 herein serving as an etching stopping film is an important layer for selectively removing the silicon oxide film 14 in the etching step. Specifically, in this embodiment, the silicon oxide film 14 to be etched is formed on the substrate having a significant surface level difference, and its thickness greatly varies in local sites. In that condition, if etching the film 14 is effected in the absence of the etching stopping film, some other sites will be inevitably overetched, or that is, the source/drain region 11 will be overetched, or the side wall 10 will be greatly overetched. As a result, the withstand voltage for dielectric breakdown between the gate electrode 7 and the upper interconnection layer to be embedded into the contact hole 19 will lower.

Once the silicon oxide film 14 of which the difference greatly varies in local sites were etched away in the manner noted above, then the silicon nitride film 13 and the silicon oxide film 12 which are thin and have a uniform thickness shall be etched in the next step. This etching step has no problem of overetching, and it is relatively easy to ensure a high etching selectivity of the two films 12 and 13 relative to the Si substrate 1. To etch the two films, used was an etching gas consisting essentially of a fluorocarbon gas. For ensuring the selectivity of the two films relative to the Si substrate 1, the amount of $O_2$ added to the etching gas was optimized.

Figure 9:
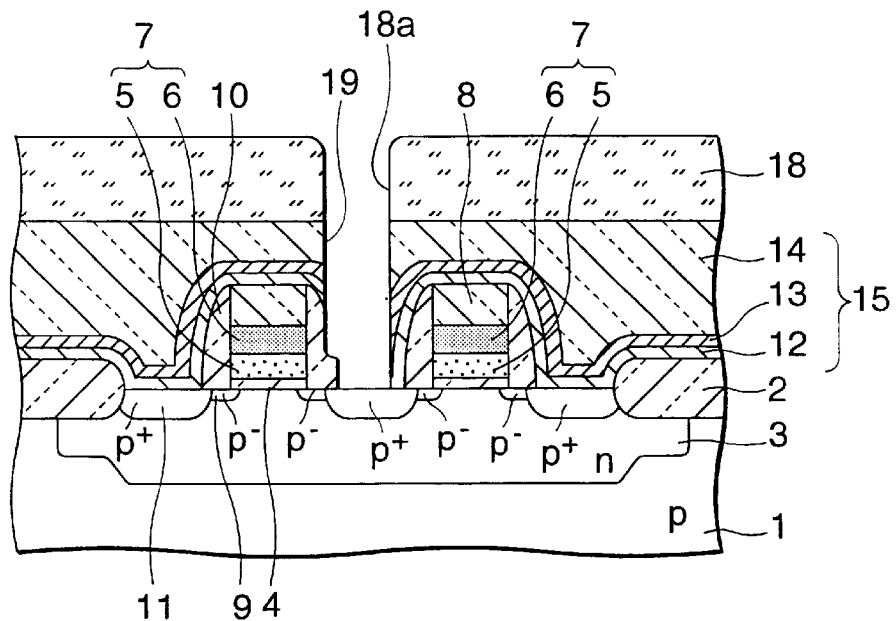

After the step, the contact hole 19 was finished to reach the source/drain region, as in FIG. 9.

After this, a compensation region may be formed through compensating ion implantation as in Example 1.

Figure 10:
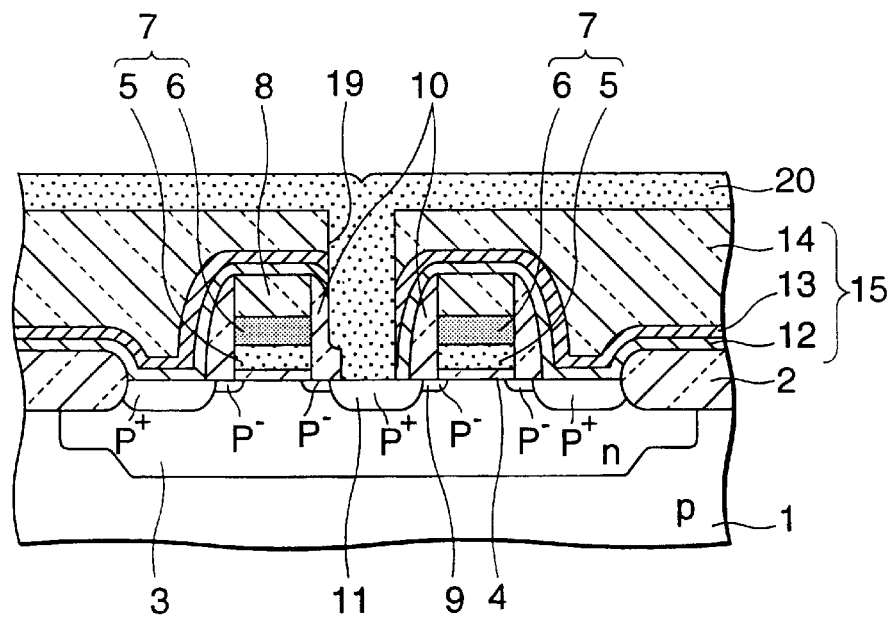

Next, as in FIG. 10, an upper interconnection layer 20 was formed to fill the contact hole 19. In this embodiment, forming a bit line contact in DRAM was intended. Therefore, a p-type polysilicon film was formed for the layer 20. This was formed, for example, as follows: First, a polysilicon film was deposited through reduced pressure CVD using $SiH_4$ gas. The temperature for the deposition fell between 580 and 620° C. Next, $B^+$ ions were implanted in the film at a dose of from $1\times10^{15}/cm^2$ to $5\times10^{15}/cm^2$. After having been thus formed, the film was subjected to RTA at 900° C. for 10 seconds to activate the boron therein. Through RTA, boron diffusion was not accelerated.

After this, the substrate was processed in an ordinary process for patterning the bit line, for forming an interlayer insulating film, for forming a memory node contact, for forming a capacitor and for other necessary steps to complete a DRAM. All those steps in the subsequent process were effected at temperatures at which boron diffusion is not accelerated. The qualities of the DRAM fabricated herein were good.

EXAMPLE 3

This is still another embodiment of the invention as applied to a SALICIDE process of fabricating a dual gate CMOS structure, for which referred to are FIG. 11 to FIG. 16.

Figure 11:
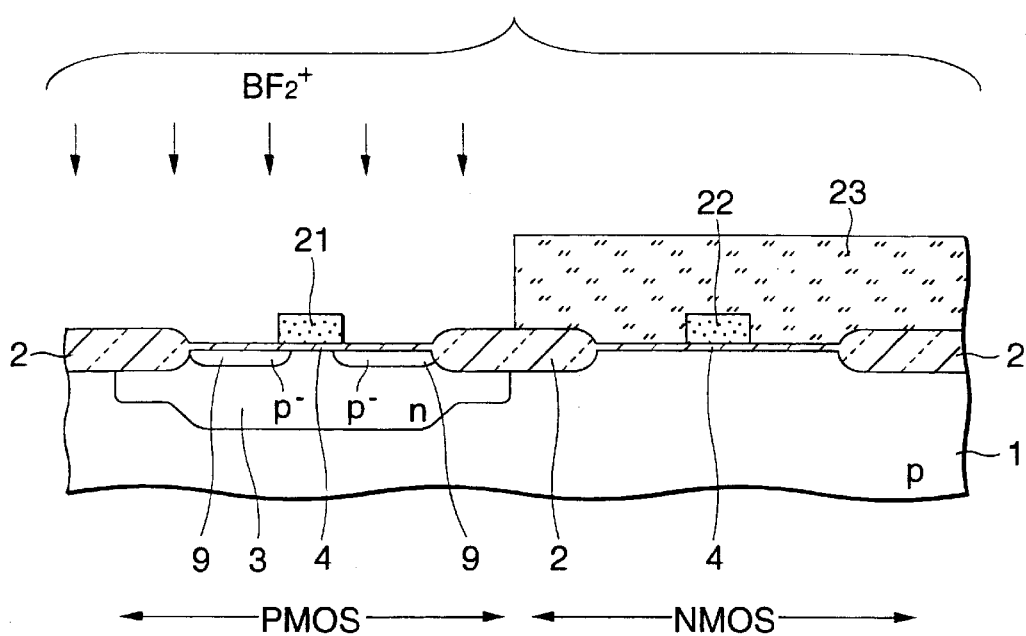

FIG. 11 shows the condition of a substrate having been subjected to element spacing, well formation and gate oxidation, in which a polysilicon film formed on the substrate was patterned to give a gate electrode 21 in the PMOS forming region and a gate electrode 22 in the NMOS forming region, and thereafter the PMOS forming region was subjected to LDD ion implantation with $BF_2^+$ while the NMOS forming region was masked with a resist pattern 23.

The gate electrodes 21 and 22 were formed, for example, as follows: A polysilicon film was deposited through reduced pressure CVD with $SiH_4$ gas at a temperature falling between 580 and 620° C. to have a thickness of from 150 to 300 nm, and this was then patterned through anisotropic dry etching with a mixed gas of $Cl_2/O_2$.

The condition for the LDD ion implantation was, for example, as follows: The $BF_2^+$ ion accelerating energy was 20 keV, and the ion dose was $2\times10^{13}/cm^2$. Through the ion implantation, for which the pattern of the gate electrode 21 served as a mask, a $p^-$-type LDD region 9 was formed in a self-aligned manner in the element forming region of the Si substrate 1.

Figure 12:
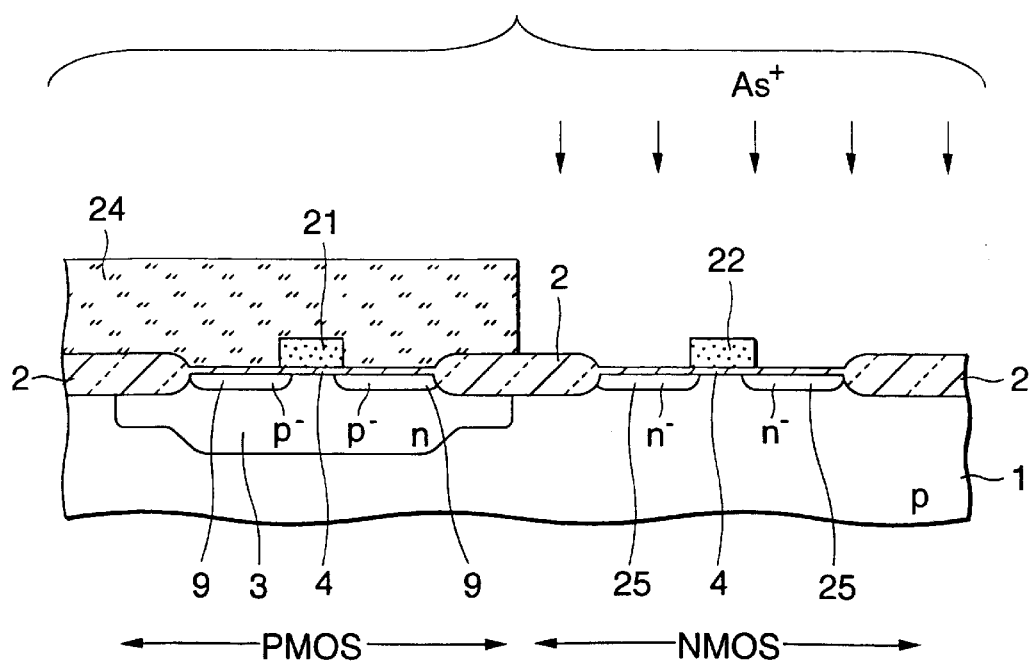

After this, the resist pattern 23 was removed, and the NMOS forming region was then subjected to LDD ion implantation with $As^+$ while the PMOS forming region was masked with a resist pattern 24, as in FIG. 12. The condition for the LDD ion implantation was, for example, as follows: The $As^+$ ion accelerating energy was 20 keV, and the ion dose was $5\times10^{13}/cm^2$. Through the ion implantation, for which the pattern of the gate electrode 22 served as a mask, an $n^-$-type LDD region 25 was formed in a self-aligned manner in the element forming region of the Si substrate 1.

The order of the ion implantation in the PMOS forming region and in NMOS forming region is not specifically defined, and the order as above may be reversed.

After this, the substrate was subjected to RTA at 1000° C. for 10 seconds, whereby the dopants having been introduced into the both regions for PMOS and NMOS were activated.

Figure 13:
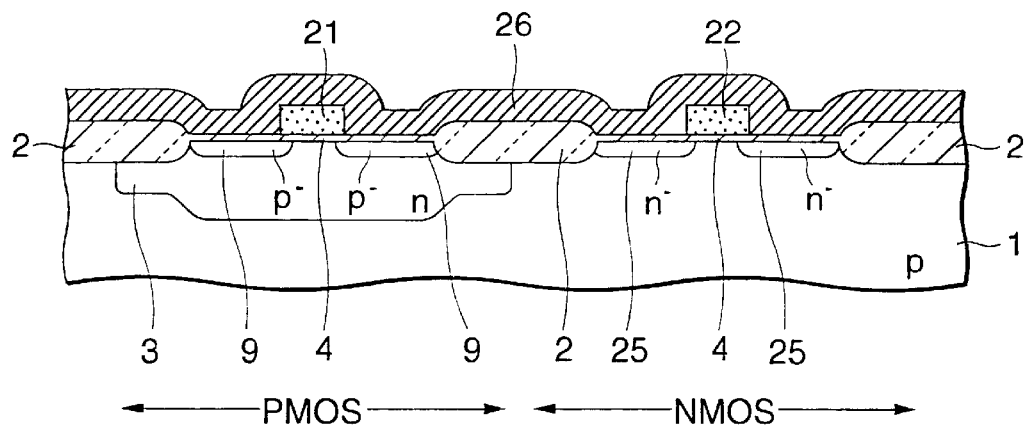

Next, as in FIG. 13, a silicon nitride film 26 to be formed into side walls was formed on the entire surface of the substrate. This was formed, for example, through reduced pressure CVD at 760° C., for which was used a mixed gas of $SiCl_2H_2/NH_3$, and its thickness was about 150 nm.

Figure 14:
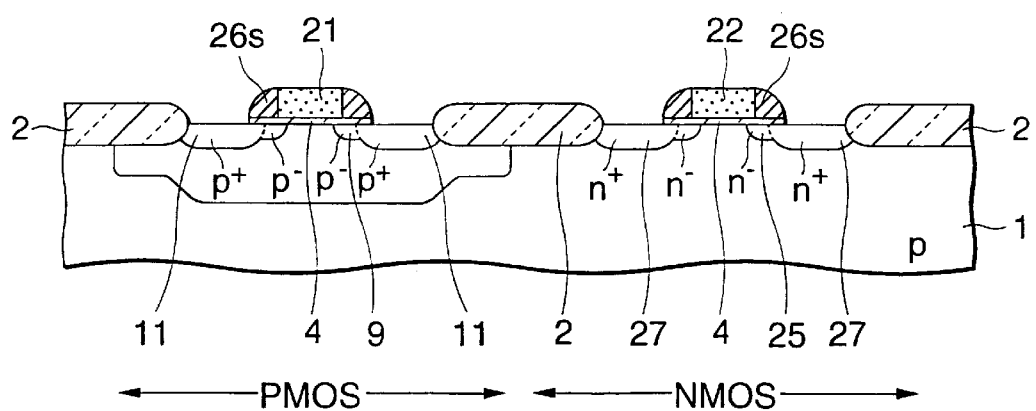

Next, as in FIG. 14, the silicon nitride film 26 was anisotropically etched back to form a side wall 26s around the gate electrodes 21 and 22.

In most cases of an ordinary SALICIDE process, the side wall 26s is formed of a silicon nitride film as herein, but not a silicon oxide film. This is because side walls of a silicon oxide film are etched with a diluted hydrofluoric acid solution to be thinner. In that condition, the silicide layer to be formed on the gate electrode will be short-circuited with the silicide layer to be formed on the source/drain region.

Next, $BF_2^+$ ions and $As^+$ ions were implanted in the PMOS forming region and the NMOS forming region, respectively, to form a p$^+$-type source/drain region 11 and an n$^+$-type source/drain region 27. The source/drain ion implantation was effected by alternately masking the NMOS forming region and the PMOS forming region with a resist pattern, in the same manner as previously for the LDD ion implantation. The condition for $BF_2^+$ and $As^+$ ion implantation was, for example, as follows: The $BF_2^+$ or $As^+$ ion accelerating energy was 20 keV, and the ion dose was $3 \times 10^{15}/cm^2$. During the ion implantation, the ions were also implanted in the gate electrodes 21 and 22. Therefore, the gate electrode 21 in the PMOS moiety became a p-type one, while the gate electrode 22 in the NMOS moiety became an n-type one.

After this, the substrate was subjected to RTA, for example, at 900° C. for 10 seconds, whereby the dopants in the p$^+$-type source/drain region 11 and the n$^+$-type source/drain region 27 were activated.

During RTA, boron diffusion in the gate electrode 21 was not accelerated.

Figure 15:
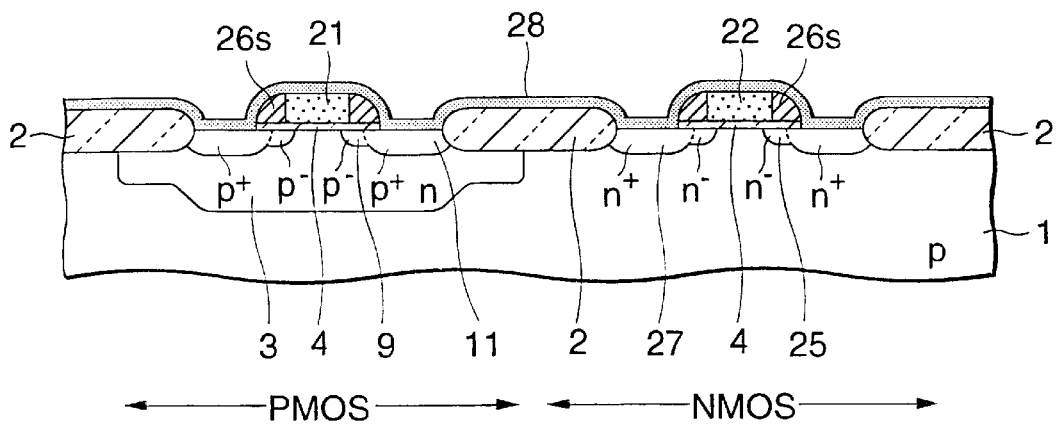
Figure 16:
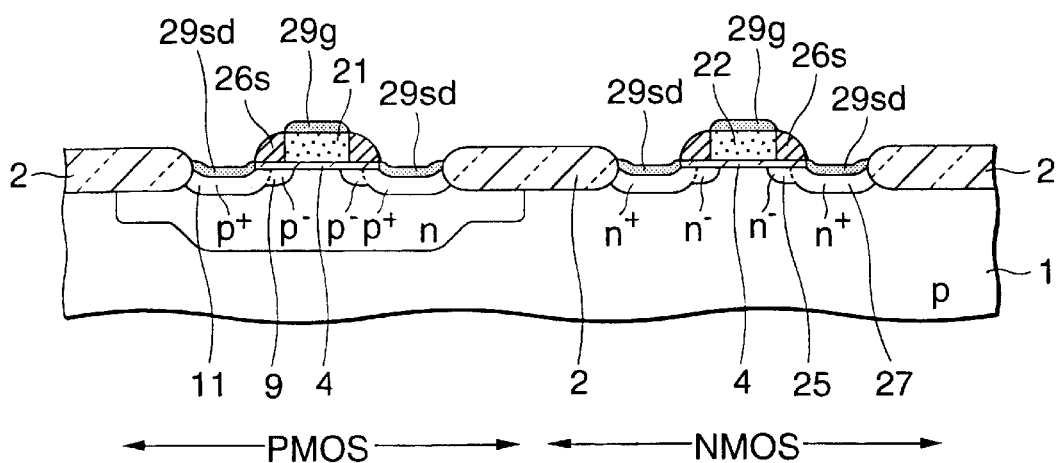

Next, as in FIG. 15, a Ti film 28 to be silisified was deposited on the entire surface of the substrate, for example, through sputtering to have a thickness of 30 nm.

In this condition, the substrate was subjected to RTA at 650° C. for 30 seconds. Through the high-temperature treatment, the Ti film 28 was silisified in a self-aligned manner in the site in which it was kept in direct contact with a silicon material. Precisely, as in FIG. 16, a TiSix layer 29g was formed on the gate electrodes 21 and 22; and a TiSix layer 29sd was on the source/drain regions 11 and 27. The non-reacted Ti film 28 having remained on the surface of the field oxide film 2 and on that of the side wall 26s was removed by dissolving it with a mixed solution of $H_2SO_4/H_2O_2$.

In this stage, TiSix in its layers formed had a crystal phase of high-resistance C49. Therefore, the layers were subjected to RTA at 800° C. for 30 seconds for phase conversion into a crystal phase of low-resistance C54. The two treatments of RTA for completing the TiSix layers did not accelerate boron diffusion.

After this, an interlayer insulating film, contact holes and an upper interconnection layer were formed all in an ordinary manner to complete a CMOS. The CMOS fabricated in this Example had the advantage of stable and quick operation without being troubled by resistance increase, threshold voltage ($V_{th}$) fluctuation or interfacial level increase.

As in the above, the present invention has been described in detail with reference to three Examples, which, however, are not intended to restrict the scope of the invention. For example, the self-aligned contact process and the SALICIDE process were in different Examples, but may be combined if desired. The silicon nitride film formed in the Examples described above serves as a part of an interlayer insulating film, or as an etching stopping film or a side wall. However, without being limited to only those applications, the silicon nitride film may be formed for any other applications so far as the temperature condition in the subsequent steps after the step of forming the film is specifically defined as intended herein so as not accelerate boron diffusion. The details of the PMOS, DRAM and CMOS structures fabricated in the Examples as above, as well as the type and the thickness of the films constituting those devices, and the process conditions for oxidation, reduced pressure CVD, ion implantation, annealing, dry etching and others may be suitably changed, modified or even combined in any desired manner.

As is obvious from the above, the present invention providing a method for fabricating a MOS transistor structure is advantageous in that, in the MOS transistor structure as fabricated to have a p-type gate electrode, especially that containing boron as the p-type dopant, along with a hydrogen-containing silicon nitride film, boron diffusion and even boron punching through the gate oxide film that may be accelerated by hydrogen in the silicon nitride film is effectively retarded. Therefore, even when the gate oxide film in the MOS transistor is thinned to have a thickness of only a few nm, flat band voltage increase in the MOS transistor is favorably retarded. The invention is especially suitable to fabrication of PMOS transistors which operate quickly and have high reliability.

Improving the properties of PMOS having a p-type gate electrode leads the improvement in the properties of dual gate-type CMOS comprising the improved PMOS, and even the improvement in the properties of memory devices and logical devices comprising it. The industrial value of the invention is extremely great.

While the invention has been described in detail and with reference to specific embodiments thereof, it will be apparent to one skilled in the art that various changes and modifications can be made therein without departing from the spirit and scope thereof.

What is claimed is:

1. A method for fabricating a MOS transistor on a surface of a substrate, which comprises a step of forming a gate electrode of a p-type silicon film containing a p-type dopant subject to diffusion from the gate electrode on a gate insulating film, the gate insulating film formed on a surface of a semiconductor substrate, and a step of forming a silicon nitride film on the substrate, and at least one step after the step of forming the silicon nitride film on the substrate, in which all steps after said step of forming the silicon nitride film are effected within a temperature range within which the diffusion of the p-type dopant existing in said p-type silicon film is prevented from being accelerated by hydrogen existing in said silicon nitride film.

2. The method for fabricating MOS transistors as claimed in claim 1, wherein said p-type silicon film contains boron, as said p-type dopant, to have a boron concentration of at least $10^{15}/cm^2$.

3. The method for fabricating MOS transistors as claimed in claim 1, wherein said silicon nitride film is formed through CVD with a raw material gas that contains a silane compound and a reducing compound.

4. The method for fabricating MOS transistors as claimed in claim 1, wherein said silicon nitride film is formed as a part of an interlayer insulating film to cover said gate electrode.

5. The method for fabricating MOS transistors as claimed in claim 1, wherein said silicon nitride film is formed as a film that serves for stopping etching in a step of forming contact holes through an interlayer insulating film that covers said gate electrode, at least in a portion of the silicon nitride film formed just above a source/drain region.

6. The method for fabricating MOS transistors as claimed in claim 1, wherein said silicon nitride film is formed as a film for forming a side wall around said gate electrode.

7. The method for fabricating MOS transistors as claimed in claim 1, wherein the step after the step of forming the silicon nitride film on the substrate is rapid thermal annealing of the MOS transistor at a temperature lower than 1000° C.

8. The method for fabricating MOS transistors as claimed in claim 1, wherein one subsequent step to follow said step of forming the silicon nitride film is for furnace annealing to be effected at a temperature lower than 850° C.

* * * * *